(12) United States Patent
Shin et al.

(10) Patent No.: US 6,927,128 B2
(45) Date of Patent: Aug. 9, 2005

(54) METHOD FOR MANUFACTURING LOW VOLTAGE FLASH MEMORY

(75) Inventors: Jung-Wook Shin, Seoul (KR); Jae-Seung Kim, Seoul (KR); Hong-Seub Kim, Seoul (KR)

(73) Assignee: Dongbuanam Semiconductor Inc., Seoul (KR)

( * ) Notice: Subject to any disclaimer, the term of this patent is extended or adjusted under 35 U.S.C. 154(b) by 0 days.

(21) Appl. No.: 09/947,419

(22) Filed: Sep. 5, 2001

(65) Prior Publication Data

US 2002/0033502 A1 Mar. 21, 2002

(30) Foreign Application Priority Data

Sep. 5, 2000 (KR) ......................................... 2000-52260

(51) Int. Cl.⁷ ..................... H01L 21/336; H01L 21/425
(52) U.S. Cl. .................. 438/257; 438/261; 438/525
(58) Field of Search .............................. 438/257, 261, 438/525

(56) References Cited

U.S. PATENT DOCUMENTS

| | | | | |
|---|---|---|---|---|
| 5,516,707 A | * | 5/1996 | Loh et al. | 438/302 |
| 5,750,435 A | * | 5/1998 | Pan | 438/525 |
| 5,804,496 A | * | 9/1998 | Duane | 438/520 |
| 5,972,783 A | * | 10/1999 | Arai et al. | 438/513 |
| 6,225,162 B1 | * | 5/2001 | Lin et al. | 257/315 |
| 6,288,433 B1 | * | 9/2001 | Akram et al. | 257/344 |
| 6,458,666 B2 | * | 10/2002 | Wasshuber | 438/302 |

\* cited by examiner

*Primary Examiner*—Howard Weiss
(74) *Attorney, Agent, or Firm*—Fulbright & Jaworski LLP

(57) ABSTRACT

A memory comprises a gate oxide layer formed on a semiconductor substrate; an ion trap region formed in a corner portion of the gate oxide layer; a floating gate formed on the gate oxide layer; a dielectric layer formed on the floating gate; a control gate formed on the dielectric layer; a spacer provided along side walls of a formed gate; an LDD formed under the spacer on the semiconductor substrate, the LDD being doped at a low concentration with impurities; and a source/drain region formed on an element region of the semiconductor substrate contacting the LDD, the source/drain region being doped at a high concentration with impurities. In one embodiment, the ion trap region is formed by performing ion injection into a corner portion of the gate oxide after the gate, including the control gate and the floating gate, is formed.

4 Claims, 5 Drawing Sheets

Silicon        Oxide layer        Floating gate

METHOD FOR MANUFACTURING LOW VOLTAGE FLASH MEMORY

BACKGROUND OF THE INVENTION (a). Field of the Invention

The present invention relates to a flash memory and a method for manufacturing the same, and more particularly, to a flash memory and a method for manufacturing the same in which the flash memory is driven by a low voltage identical to that needed to drive a logic circuit.

(b). Description of the Related Art

Flash memory has many of the benefits of EPROMs (erasable programmable read only memories) and EEPROMs (electrically erasable programmable read only memories) including erasability and reprogrammability. In addition, the manufacture of flash memory is simple and relatively inexpensive, and a small chip size may be realized.

Further, flash memory is non-volatile semiconductor memory in that data stored in it is not destroyed, even without power or backup batteries. However, the ease with which writing and erasing is electrically performed gives flash memory the characteristics of RAM (random access memory). Accordingly, flash memory is being used in memory cards and memory devices that are replacing hard disks in portable office automation systems.

The programming of data in flash memory is realized by the injection of hot electrons. That is, if hot electrons are generated in a channel by a difference in potential between a source and a drain, some of these electrons that obtain an energy greater than that of a potential barrier between polycrystalline silicon realizing a gate and an oxidation layer move to a floating gate by a high electric field trapped at a control gate to be stored.

Since hot electrons cause a degradation of performance in a typical MOS element, the elements are designed to minimize this effect. However, flash memory is designed to generate hot electrons.

Conventional flash memory will be described with reference to FIG. 1.

A gate oxide layer 2 is formed on a portion of an element region of a semiconductor substrate 1. Formed on the gate oxide layer 2 is a floating gate 3, which is made of polysilicon. The floating gate 3 is fully encased and acts as an electronic storage node. Further, a dielectric layer 4 is formed on the floating gate 3. The dielectric layer 4 is realized through a layered structure of an oxide layer, a nitride layer, and then again an oxide layer. A control gate 5, made from polysilicon, is formed on the dielectric layer 4, and performs the function of a gate in a typical MOS transistor.

Provided along side walls of a gate, comprised of the gate oxide layer 2, the floating gate 3, the dielectric layer 4, and the control gate 5, is a spacer 7. Further, an LDD (lightly doped drain) 6, doped at a low concentration with impurities of an opposite conductivity as the semiconductor substrate 1, is formed under the spacer 7 on the semiconductor substrate 1. Formed on the semiconductor substrate 1 contacting the LDD 6 and extending away from the spacer 7 and the elements of the gate is a source/drain region 8. The source/drain region 8 is doped at a high concentration with impurities of the same conductivity as the LDD 6.

With reference to FIG. 2, in the conventional flash memory structured as in the above, electrons flow to the floating gate from the semiconductor substrate in accordance with the operation of the element, as a result of F-N (Fowler-Nordheim) tunneling. At this time, a current density $J_{FN}$ is as shown in Equation 1 below.

$$J_{FN} = \alpha_{FN} E_{OX}^2 \exp[\beta_{FN}/E_{OX}] \qquad \text{[Equation 1]}$$

where $\alpha_{FN}$ and $\beta_{FN}$ are respectively functional constants of an effective mass and a barrier height, and $E_{OX}$ is an electric field on both ends of an oxidation layer.

With the conventional flash memory, the drive voltage of the element is dependent on the thickness of the oxidation layer, and generally has a programming voltage of between 5 and 8V. However, since the logic circuit is driven at a different voltage of approximately 3.3V, it is not possible to provide both the flash memory and logic circuit on a single chip.

SUMMARY OF THE INVENTION

The present invention has been made in an effort to solve the above problems.

It is an object of the present invention to provide a flash memory and a method for manufacturing the same, in which the flash memory is driven by a low voltage identical to that needed to drive a logic circuit such that the flash memory and logic circuit may be provided on a single chip.

To achieve the above object, the present invention provides a low voltage flash memory comprising; a gate oxide layer formed on a portion of an element region of a semiconductor substrate; an ion trap region formed in a corner portion of the gate oxide layer; a floating gate formed on the gate oxide layer; a dielectric layer formed on the floating gate; a control gate formed on the dielectric layer; a spacer provided along side walls of the gate oxide layer, the floating gate, the dielectric layer, and the control gate; an LDD formed under the spacer on the semiconductor substrate, the LDD being doped at a low concentration with impurities; and a source/drain region formed on an element region of the semiconductor substrate contacting the LDD, the source/drain region being doped at a high concentration with impurities.

According to a feature of the present invention, the ion trap region is formed of impurities injected in a corner portion of the gate oxide layer.

According to another feature of the present invention, the impurities forming the ion trap are comprised of either nitrogen, phosphorus, boron, or arsenic.

According to yet another feature of the present invention, the dielectric layer is formed of a layered structure including an oxidation layer, a nitrate layer, and another oxidation layer.

The method for manufacturing the low voltage flash memory comprises the steps of growing a gate oxide layer by thermally oxidizing a semiconductor substrate in which element regions are defined, depositing a first polysilicon layer over an entire surface of the gate oxide layer, and patterning the first polysilicon layer to form a floating gate; depositing a dielectric layer on the semiconductor substrate and the floating gate, depositing a second polysilicon layer on the dielectric layer, and forming a gate pattern on the second polysilicon layer at a position corresponding to above the floating gate; etching exposed portions of the second polysilicon layer to form a control gate, etching portions of the dielectric layer exposed as a result to remove the same, and etching portions of the gate oxide layer that are, in turn, exposed as a result, after which the gate pattern is removed; performing ion injection into a corner portion of the gate oxide layer at a predetermined angle; performing ion injection of impurities on exposed portions of the semiconductor substrate at a low concentration to form an LDD; depositing an insulating layer over the entire surface of the semiconductor substrate, and etching the insulating layer to form a spacer on the LDD and along side walls of the gate oxide layer, the floating gate, the dielectric layer, and the control gate; and forming a source/drain region on exposed regions of the semiconductor substrate by performing ion injection of impurities at a high concentration.

According to a feature of the present invention, in the step of depositing the dielectric layer on the semiconductor substrate and the floating gate, depositing the second polysilicon layer on the dielectric layer, and forming the gate pattern on the second polysilicon layer at a position corresponding to above the floating gate, the dielectric layer is deposited by sequentially depositing an oxide layer, a nitride layer, and another oxide layer.

According to another feature of the present invention, in the step of performing ion injection into the corner portion of the gate oxide layer at a predetermined angle, the angle is between 5 and 45 degrees.

According to yet another feature of the present invention, to ensure that the impurities are dispersed only in the corner portion of the gate oxide layer during ion injection, a low energy is used to perform the ion injection of the impurities.

According to still yet another feature of the present invention, in the step of performing ion injection into the corner portion of the gate oxide layer at a predetermined angle, the ion injection is performed with impurities selected from the group consisting of nitrogen, phosphorus, boron and arsenic.

BRIEF DESCRIPTION OF THE DRAWINGS

The accompanying drawings, which are incorporated in and constitute to a part of the specification, illustrate an embodiment of the invention, and, together with the description, serve to explain the principles of the invention.

DETAILED DESCRIPTION OF THE PREFERRED EMBODIMENTS

Preferred embodiments of the present invention will now be described in detail with reference to the accompanying drawings.

Figure 1:
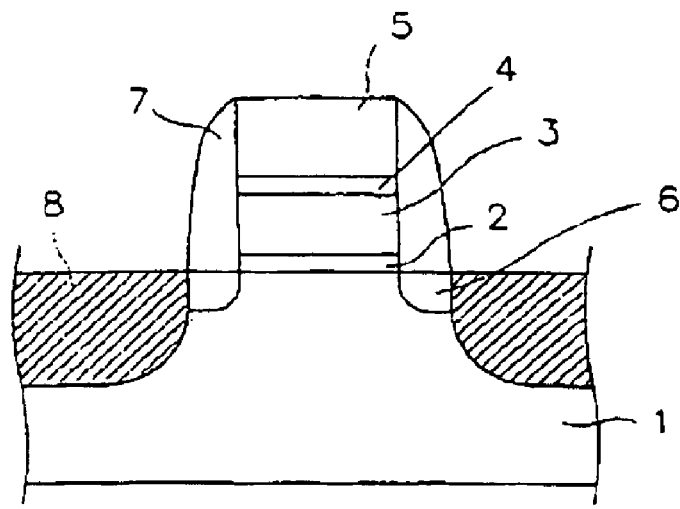
FIG. 1 is a schematic sectional view of a conventional flash memory.
Figure 2:
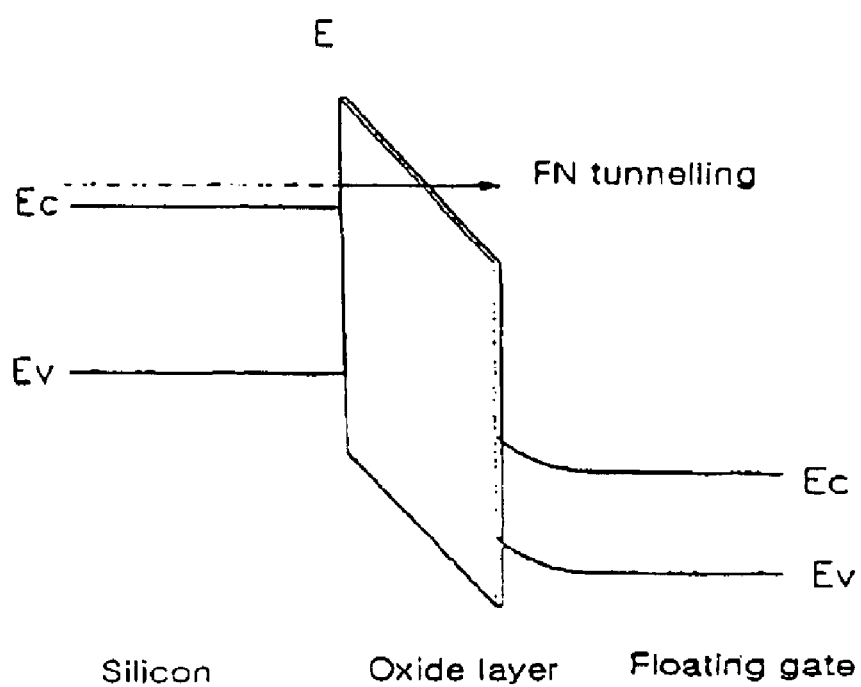
FIG. 2 is a schematic view of a bandgap of a silicon/oxidation layer/floating gate in a conventional flash memory.
Figure 3:
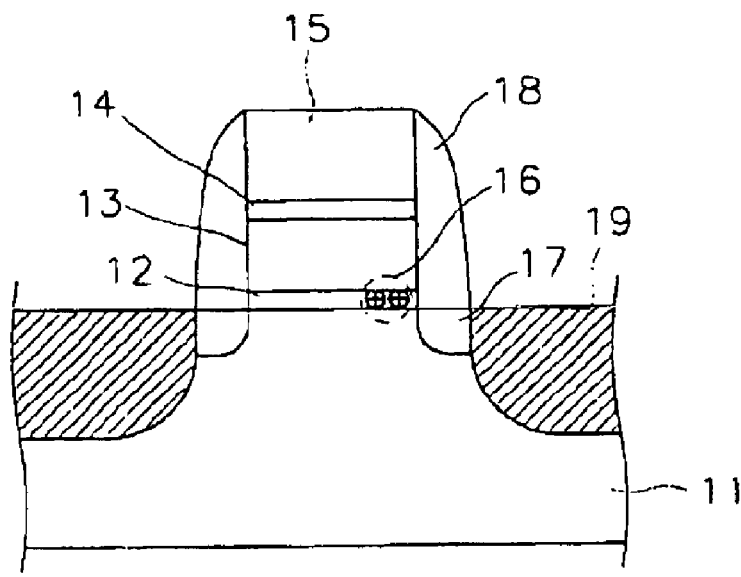
FIG. 3 is a schematic sectional view of a low voltage flash memory according to a preferred embodiment of the present invention.

FIG. 3 shows a schematic sectional view of a low voltage flash memory according to a preferred embodiment of the present invention.

As shown in the drawing, a gate oxide layer 12 is formed on a portion of an element region of a semiconductor substrate 11. Provided in a corner portion of the gate oxide layer 12 is an ion trap region 16, and it is preferable that the ion trap region 16 is formed of impurities such as nitrogen, phosphorus, boron and arsenic. Further, formed on the gate oxide layer 12 is a floating gate 13, which is made of polysilicon, and which is fully encased and acts as an electronic storage node. A dielectric layer 14 is formed on the floating gate 13. The dielectric layer 14 is realized through a layered structure of an oxide layer, a nitride layer, and then again an oxide layer. A control gate 15, made from polysilicon, is formed on the dielectric layer 14, and performs the function of a gate in a typical MOS transistor.

Provided along side walls of a gate, comprised of the gate oxide layer 12 having the ion trap region 16 in the corner portion, the floating gate 13, the dielectric layer 14, and the control gate 15, is a spacer 18, which is formed of an insulating material. Further, an LDD (lightly doped drain) 17, doped at a low concentration with impurities of an opposite conductivity as the semiconductor substrate 11, is formed under the spacer 18 on the semiconductor substrate 11. Formed on the semiconductor substrate 11 contacting the LDD 17 and extending away from the spacer 18 and the elements of the gate is a source/drain region 19. The source/drain region 19 is doped at a high concentration with impurities of the same conductivity as the LDD 17.

Figure 4:
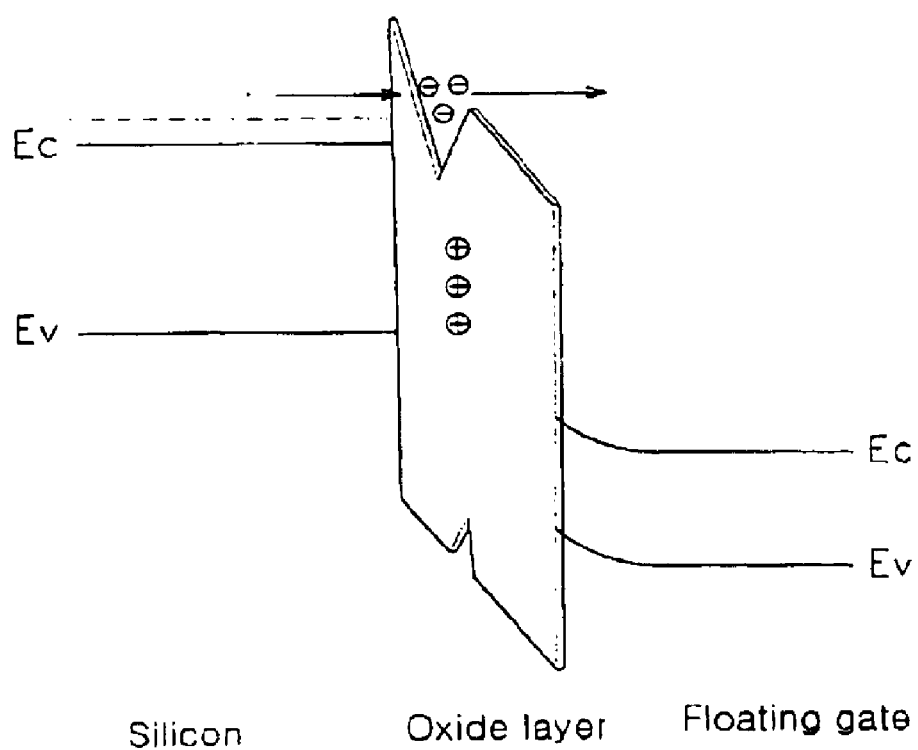
FIG. 4 is a schematic view of a bandgap of a silicon/oxidation layer/floating gate in the low voltage flash memory of FIG. 3.

With reference to FIG. 4, in the flash memory of the present invention structured as in the above, since the movement of electric charge to the floating gate from the semiconductor substrate is performed by passing through the trap, programming is performed at a substantially lower drive voltage than that which occurs with the conventional F-N tunneling. That is, as a result of the ion trap region formed in the corner portion of the gate oxide layer, which is provided under the floating gate, a potential barrier of the oxide layer is curved and the flow of electrons includes passing through the trap. Accordingly, a significantly higher current density than in the conventional F-N tunneling is obtained, which, in turn, results in a high electron tunneling probability such that the programming voltage may be reduced to a level similar to the drive voltage of a peripheral logic circuit.

FIGS. 5a to 5e show schematic sectional views of the low voltage flash memory of FIG. 3 as it undergoes sequential manufacturing processes.

Figure 5A:
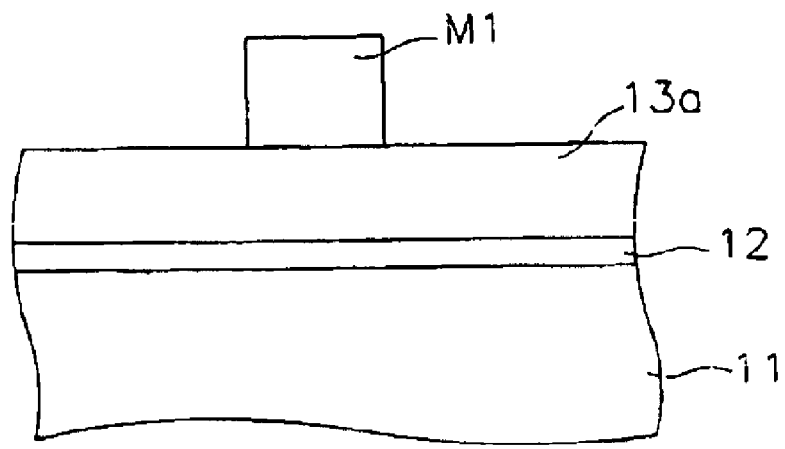
FIGS. 5a to 5e are schematic sectional views of the low voltage flash memory of FIG. 3 as it undergoes sequential manufacturing processes.

First, with reference to FIG. 5a, the semiconductor substrate is thermally oxidized to grow the gate oxide layer 12 in element regions. Next, after a polysilicon layer 13a is deposited on the gate oxide layer 12, a gate pattern M1 is formed on the polysilicon layer 13a. As an example of the formation of the gate pattern M1, a photosensitive layer is deposited on the polysilicon layer 13a, then after the photosensitive layer 13a is exposed using a mask that forms a gate pattern, the photosensitive layer 13a is developed to realize a photosensitive layer pattern.

Figure 5B:
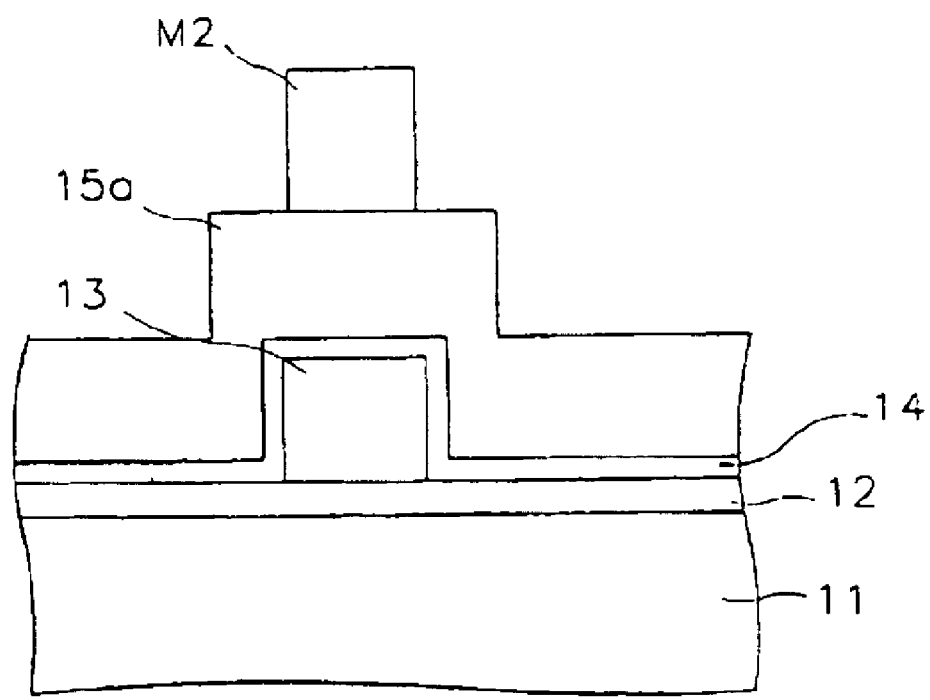

Next, with reference to FIG. 5b, exposed portions of the polysilicon layer 13a are etched (i.e., patterned) to form the floating gate 13, after which the gate pattern M1 is removed. The dielectric layer 14 is then deposited on the semiconductor substrate 11 and the floating gate 13, and a polysilicon layer 15a is deposited on the dielectric layer 14. It is preferable that the dielectric layer 14 is realized through a layered structure of an oxide layer, a nitride layer, and another oxide layer.

Next, a gate pattern M2 is formed on the polysilicon layer 15a at a position corresponding to above the floating gate 13. As an example of the formation of the gate pattern M2, a photosensitive layer is deposited on the polysilicon layer 15a, then after the photosensitive layer 15a is exposed using a mask that forms a gate pattern, the photosensitive layer 15a is developed to realize a photosensitive layer pattern.

Figure 5C:
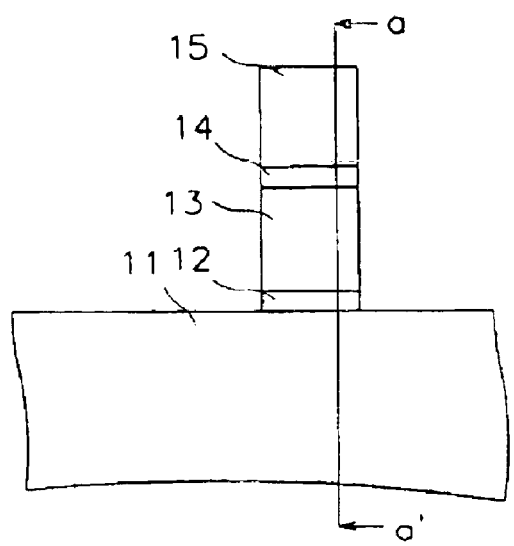
Figure 5D:
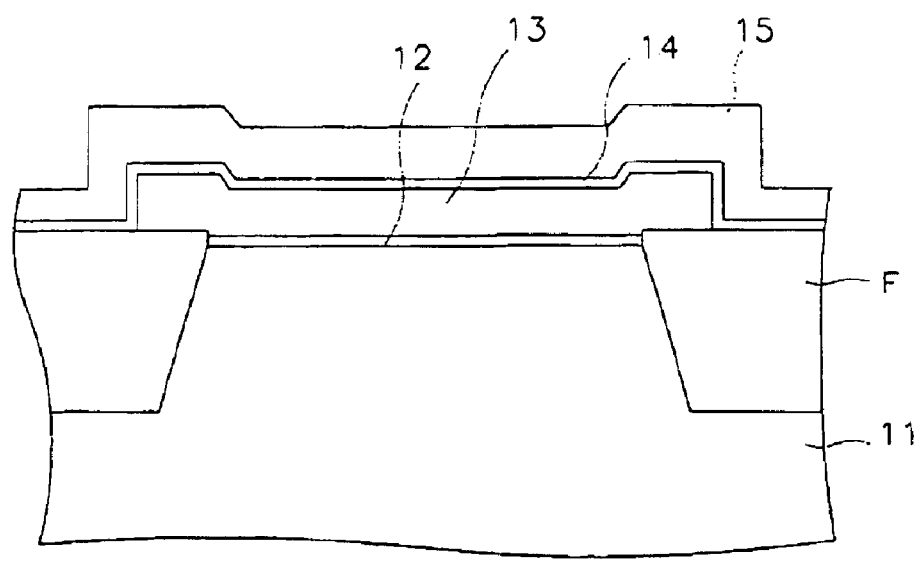

Following the above, with reference to FIG. 5c, exposed portions of the polysilicon layer 15a are etched (i.e., patterned) to form the control gate 15. Portions of the dielectric layer 14 exposed as a result are etched to remove the same, and portions of the gate oxide layer 12 that are, in turn, exposed as a result are etched, thereby completing the gate of the flash memory. The gate pattern M2 is then removed. With reference to FIG. 5d, which shows a sectional view taken along line a–a' of FIG. 5c, a gate of a flash memory formed of a layered structure including the gate oxide layer 12, the floating gate 13, the dielectric layer 14, and the control gate 15 is realized on an element region of a semiconductor substrate 11, which includes a field oxide layer F defining an element separation region.

Figure 5E:
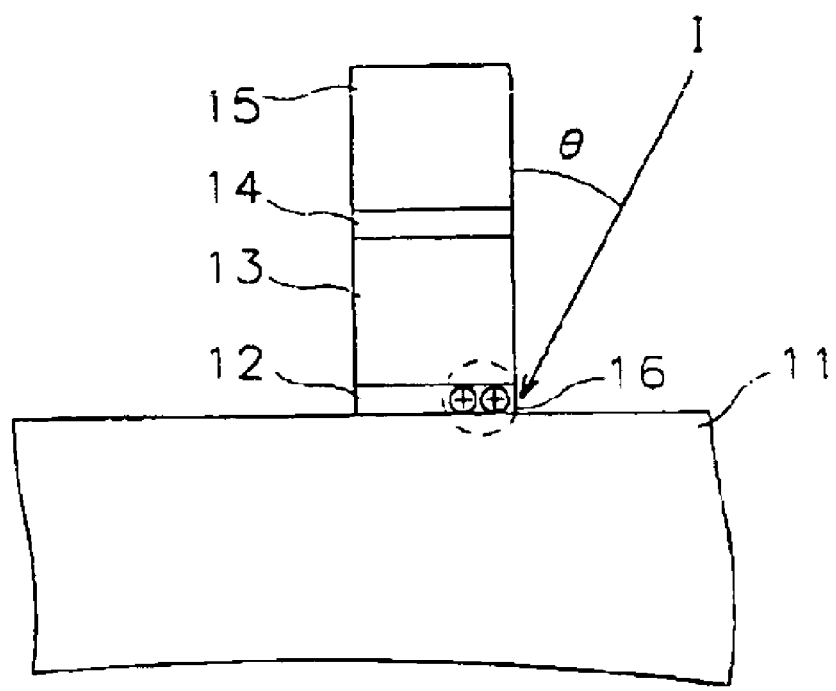

With reference to FIG. 5e, ion injection into the corner portion of the gate oxide layer 12 is performed at a predetermined angle θ of preferably between 5 and 45 degrees to thereby form the ion trap region 16. At this time, to ensure that impurities are dispersed only in the corner portion of the gate oxide layer 12 as a result of the ion injection, it is preferable that a low energy is used to perform the ion injection of the impurities. Also, it is preferable that impurities such as nitrogen, phosphorous, boron and arsenic are used.

Next, referring again to FIG. 3, the LDD 17, which is doped at a low concentration with impurities of an opposite conductivity as the semiconductor substrate 11, is formed on the semiconductor substrate 11. After this process, an insulating layer is deposited over the entire surface of the semiconductor substrate 11, after which the insulating layer is etched to form the spacer 18 on the LDD 17 and along side walls of the gate, the gate including the gate oxide layer 12, the floating gate 13, the dielectric layer 14, and the control gate 15. Finally, the source/drain region 19 is formed on the semiconductor substrate 11 contacting the LDD 17 and extending away from the spacer 18 and the elements of the gate. The source/drain region 19 is doped at a high concentration with impurities of the same conductivity as the LDD 17.

In the low voltage flash memory of the present invention as described above, with the formation of the ion trap region in the corner portion of the gate oxide layer, which is provided between the semiconductor substrate and the floating gate, the flow of electrons to the floating gate is realized through tunneling through the trap and not F-N tunneling as in the prior art. Accordingly, the flash memory may be operated at a voltage that is as low as that required to drive a logic circuit such that these two elements may be provided on a single chip.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A method of manufacturing a low voltage flash memory for integration into a single chip together with a logic circuit, the method comprising the steps of: growing a gate oxide layer by thermally oxidizing a semiconductor substrate in which element regions are defined, depositing a first polysilicon layer over an entire surface of the gate oxide layer, and patterning the first polysilicon layer to form a floating gate;

depositing a dielectric layer on the semiconductor substrate and the floating gate, depositing a second polysilicon layer on the dielectric layer, and forming a gate pattern on the second polysilicon layer at a position corresponding to above the floating gate;

etching exposed portions of the second polysilicon layer to form a control gate, etching portions of the dielectric layer exposed as a result to remove the same, and etching portions of the gate oxide layer that are, in turn, exposed as a result, after which the gate pattern is removed;

performing ion injection directly into the gate oxide layer at an energy level sufficiently low whereby the ion injection is limited to a corner portion of the gate oxide layer at a predetermined angle to form an ion trap region and to decrease an operation voltage of the flash memory such that the operation voltage of the flash memory conforms with an operation voltage of the logic circuit, where the ion injection is performed with impurities selected from the group consisting of phosphorus, boron and arsenic;

performing ion injection of impurities on exposed portions of the semiconductor substrate at a low concentration to form an LDD;

depositing an insulating layer over the entire surface of the semiconductor substrate, and isotropically etching the insulating layer to form a spacer on the LDD and along side walls of the gate oxide layer, the floating gate, the dielectric layer, and the control gate;

and forming a source/drain region on exposed regions of the semiconductor substrate by performing ion injection of impurities at a high concentration.

2. The method of claim 1 wherein in the step of depositing the dielectric layer on the semiconductor substrate and the floating gate, depositing the second polysilicon layer on the dielectric layer, and forming the gate pattern on the second polysilicon layer at a position corresponding to above the floating gate, the dielectric layer is deposited by sequentially depositing an oxide layer, a nitride layer, and another oxide layer.

3. The method of claim 1 wherein in the step of performing ion injection into the corner portion of the gate oxide layer at a predetermined angle, the angle is between 5 and 45 degrees.

4. The method of claim 1 in which the ion injection is limited to a single corner portion of the gate oxide layer.

* * * * *